United States Patent
Kontani et al.

(10) Patent No.: US 8,875,656 B2
(45) Date of Patent: Nov. 4, 2014

(54) SUBSTRATE PROCESSING APPARATUS

(75) Inventors: Tadashi Kontani, Toyama (JP); Tetsuo Yamamoto, Toyama (JP); Nobuhito Shima, Imizu (JP); Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 914 days.

(21) Appl. No.: 12/382,331

(22) Filed: Mar. 13, 2009

(65) Prior Publication Data
US 2009/0241835 A1 Oct. 1, 2009

(30) Foreign Application Priority Data

Apr. 1, 2008 (JP) ................................. 2008-094503
Jan. 22, 2009 (JP) ................................. 2009-011769

(51) Int. Cl.
*C23C 16/00* (2006.01)
*C23C 16/452* (2006.01)
*C23C 16/34* (2006.01)
*C23C 16/455* (2006.01)

(52) U.S. Cl.
CPC ............. *C23C 16/345* (2013.01); *C23C 16/452* (2013.01); *C23C 16/45544* (2013.01); *C23C 16/45542* (2013.01)
USPC .......... 118/723 R; 118/723 ME; 118/723 ER; 118/723 IR

(58) Field of Classification Search
USPC .... 118/722, 723 R, 723 ME, 723 ER, 723 IR
See application file for complete search history.

(56) References Cited

U.S. PATENT DOCUMENTS

| | | | | |
|---|---|---|---|---|
| 5,958,195 A | * | 9/1999 | Lorincz et al. | ............ 204/224 M |
| 6,103,076 A | * | 8/2000 | Mizuno | ...................... 204/286.1 |
| 6,184,623 B1 | | 2/2001 | Sugai et al. | |
| 6,310,334 B1 | * | 10/2001 | Niwa et al. | ..................... 219/644 |
| 2003/0164143 A1 | | 9/2003 | Toyoda et al. | |
| 2004/0025786 A1 | | 2/2004 | Kontani et al. | |
| 2007/0190263 A1 | * | 8/2007 | Finch et al. | ................... 427/476 |
| 2007/0246355 A1 | | 10/2007 | Toyoda et al. | |
| 2008/0060580 A1 | | 3/2008 | Toyoda et al. | |
| 2008/0066681 A1 | | 3/2008 | Toyoda et al. | |
| 2008/0093215 A1 | | 4/2008 | Toyoda et al. | |

(Continued)

FOREIGN PATENT DOCUMENTS

JP A-2003-297818 10/2003
JP 2004-124234 * 4/2004 ............ C23C 16/509

(Continued)

OTHER PUBLICATIONS

Korean Office Action for corresponding Korean Patent Application No. 10-2009-0023849, mailed on Oct. 22, 2010 (w/ English translation).

*Primary Examiner* — Keath Chen
(74) *Attorney, Agent, or Firm* — Oliff PLC

(57) ABSTRACT

A substrate processing apparatus includes a processing chamber in which a substrate is mounted, a gas supply unit that supplies processing gas into the processing chamber, a gas exhaust unit that exhausts atmospheric gas in the processing chamber, first and second electrodes to which high-frequency power is applied to set the processing gas to an active state. Each of the first and second electrodes includes a core wire formed of a metal and plural pipe bodies that are joined to one another through the core wire so as to be bendable, and less thermally deformed than the core wire.

9 Claims, 12 Drawing Sheets

(56) References Cited

U.S. PATENT DOCUMENTS

| | | |
|---|---|---|
| 2008/0121180 A1 | 5/2008 | Kontani et al. |
| 2008/0153308 A1* | 6/2008 | Ogawa et al. ............... 438/758 |
| 2008/0251014 A1 | 10/2008 | Kontani et al. |
| 2008/0251015 A1 | 10/2008 | Kontani et al. |
| 2009/0133630 A1 | 5/2009 | Toyoda et al. |
| 2009/0155496 A1* | 6/2009 | Wilderbeek et al. ......... 428/1.33 |
| 2009/0159440 A1 | 6/2009 | Toyoda et al. |
| 2010/0263593 A1 | 10/2010 | Kontani et al. |

FOREIGN PATENT DOCUMENTS

| | | |
|---|---|---|
| KR | A-2000-0011806 | 2/2000 |
| WO | WO 2005/083766 A1 | 9/2005 |
| WO | WO 2007/055138 A1 | 5/2007 |

* cited by examiner

FIG. 10

MEASUREMENT DATA OF FILM AT PROCESSING
TEMPERATURE OF 470°C

WHEN ELECTRODE HAVING NO SHORT PIPE IS USED

|  | UPPER SIDE | CENTER PORTION | LOWER SIDE |
|---|---|---|---|
| THICKNESS (Å) | 382.08 | 393.55 | 393.82 |
| IN-PLANE UNIFORMITY (%) | 1.19 | 1.61 | 1.63 |
| INTER-PLANE UNIFORMITY (%) | 1.506 | | |

WHEN ELECTRODE HAVING Ni SHORT PIPES IS USED

|  | UPPER SIDE | CENTER PORTION | LOWER SIDE |
|---|---|---|---|
| THICKNESS (Å) | 385.58 | 395.52 | 396.11 |
| IN-PLANE UNIFORMITY (%) | 1.02 | 1.56 | 1.60 |
| INTER-PLANE UNIFORMITY (%) | 1.341 | | |

WHEN ELECTRODE HAVING QUARTZ SHORT PIPES IS USED

|  | UPPER SIDE | CENTER PORTION | LOWER SIDE |
|---|---|---|---|
| THICKNESS (Å) | 390.37 | 399.69 | 401.57 |
| IN-PLANE UNIFORMITY (%) | 0.88 | 1.41 | 1.47 |
| INTER-PLANE UNIFORMITY (%) | 1.409 | | |

FIG. 11

VARIATION RATE FOR EACH PERIPHERAL DIRECTION
WHEN ELECTRODE HAVING Ni SHORT PIPES ARE USED
UNDER PROCESSING TEMPERATURE OF 470°C

|  | UPPER SIDE | CENTER PORTION | LOWER SIDE |
|---|---|---|---|
| CENTER POSITION | 0.6% | 0.5% | 0.6% |
| POSITION 1 | 0.7% | 0.5% | 0.6% |
| POSITION 2 | 0.9% | 0.5% | 0.6% |
| POSITION 3 | 1.0% | 0.5% | 0.6% |

VARIATION RATE FOR EACH PERIPHERAL DIRECTION WHEN
ELECTRODE HAVING QUARTZ SHORT PIPES ARE USED UNDER
PROCESSING TEMPERATURE OF 470°C

|  | UPPER SIDE | CENTER PORTION | LOWER SIDE |
|---|---|---|---|
| CENTER POSITION | 1.7% | 1.3% | 1.8% |
| POSITION 1 | 1.8% | 1.4% | 1.8% |
| POSITION 2 | 2.1% | 1.5% | 1.9% |
| POSITION 3 | 2.3% | 1.6% | 2.0% |

FIG. 12

MEASUREMENT DATA OF FILM
AT PROCESSING TEMPERATURE OF 545°C

WHEN ELECTRODE HAVING NO SHORT PIPE IS USED

|  | UPPER SIDE | CENTER PORTION | LOWER SIDE |
|---|---|---|---|
| THICKNESS (Å) | 370.39 | 377.15 | 374.98 |
| IN-PLANE UNIFORMITY (%) | 1.24 | 1.70 | 1.77 |
| INTER-PLANE UNIFORMITY (%) | 0.903 | | |

WHEN ELECTRODE HAVING Ni SHORT PIPES IS USED

|  | UPPER SIDE | CENTER PORTION | LOWER SIDE |
|---|---|---|---|
| THICKNESS (Å) | 371.98 | 377.51 | 375.13 |
| IN-PLANE UNIFORMITY (%) | 1.10 | 1.61 | 1.69 |
| INTER-PLANE UNIFORMITY (%) | 0.737 | | |

WHEN ELECTRODE HAVING QUARTZ SHORT PIPES IS USED

|  | UPPER SIDE | CENTER PORTION | LOWER SIDE |
|---|---|---|---|
| THICKNESS (Å) | 377.10 | 381.28 | 379.78 |
| IN-PLANE UNIFORMITY (%) | 0.95 | 1.45 | 1.61 |
| INTER-PLANE UNIFORMITY (%) | 0.551 | | |

FIG. 13

VARIATION RATE FOR EACH PERIPHERAL DIRECTION WHEN ELECTRODE HAVING Ni SHORT PIPES ARE USED UNDER PROCESSING TEMPERATURE OF 545°C

|  | UPPER SIDE | CENTER PORTION | LOWER SIDE |
|---|---|---|---|
| CENTER POSITION | 0.4% | 0.1% | 0.0% |
| POSITION 1 | 0.4% | 0.1% | 0.0% |
| POSITION 2 | 0.4% | 0.1% | 0.0% |
| POSITION 3 | 0.5% | 0.1% | 0.1% |

VARIATION RATE FOR EACH PERIPHERAL DIRECTION WHEN ELECTRODE HAVING QUARTZ SHORT PIPES ARE USED UNDER PROCESSING TEMPERATURE OF 545°C

|  | UPPER SIDE | CENTER PORTION | LOWER SIDE |
|---|---|---|---|
| CENTER POSITION | 1.5% | 0.9% | 1.1% |
| POSITION 1 | 1.6% | 0.9% | 1.2% |
| POSITION 2 | 1.7% | 1.1% | 1.3% |
| POSITION 3 | 1.9% | 1.2% | 1.4% |

SUBSTRATE PROCESSING APPARATUS

BACKGROUND OF THE INVENTION

1. Field of the Invention

The present invention relates to a substrate processing apparatus used as a semiconductor manufacturing apparatus such as a batch type plasma processing apparatus or the like.

2. Description of the Related Art

Domestic Re-publication of PCT Patent Application WO2005/083766 discloses a substrate processing apparatus having a processing chamber in which at least one substrate is mounted, a gas supply system that supplies processing gas into the processing chamber, an exhaust system that exhausts atmospheric gas in the processing chamber and at least a pair of electrodes that are accommodated so as to be insertable into and removable from a protection tube so that the processing gas is set to an active state. In this substrate processing apparatus, each of the electrodes is mounted in the protection tube while at least a part thereof is bent, and the electrodes are formed of flexible members.

In the technique described above, the electrodes formed of the flexible members shrink in the protection tube due to heat or gravitational force, and the condition in the processing chamber such as a plasma distribution condition or the like is made inhomogeneous due to the shrinkage of the electrodes. Therefore, the above technique has a problem that the quality of processed substrates is inhomogeneous.

SUMMARY OF THE INVENTION

An object of the present invention is to provide a substrate processing apparatus with which electrodes is made to hardly shrink and thus the quality of processed substrates is uniform.

In order to attain the above object, a first aspect of the present invention is directed to a substrate processing apparatus including: a processing chamber in which a substrate is mounted; a gas supply unit that supplies processing gas into the processing chamber; a gas exhaust unit that exhausts atmospheric gas in the processing chamber; at least a pair of electrodes to which high-frequency power is applied to set the processing gas to an active state; and a mount pipe in which each of the pair of electrodes is mounted while at least one place thereof is bent, wherein each of the electrodes comprises a core wire formed of a metal and plural pipe bodies that are joined to one another through the core wire so as to be bendable, and less thermally deformed than the core wire.

A second aspect of the present invention is directed to the substrate processing apparatus of the first aspect, wherein the pipe bodies are formed of a metal or insulating material.

A third aspect of the present invention is directed to the substrate processing apparatus of the second aspect, wherein the pipe bodies are formed of quartz.

A fourth aspect of the present invention is directed to the substrate processing apparatus of the first aspect, wherein the shape of the pipes is substantially cylindrical or substantially spherical.

A fifth aspect of the present invention is directed to the substrate processing apparatus of the first aspect, wherein the core wire is formed of a plastically deformable metal.

A sixth aspect of the present invention is directed to the substrate processing apparatus of the first aspect, wherein the core wire is formed of nickel.

A seventh aspect of the present invention is directed to the substrate processing apparatus of the first aspect, wherein each of the electrodes is further provided with a flexible meshed member that is formed of a metal and provided so as to cover the outer surfaces of the plural pipe bodies.

An eighth aspect of the present invention is directed to the substrate processing apparatus of the first aspect, wherein the pipe bodies are formed of an electrically conductive material.

A ninth aspect of the present invention is directed to a substrate processing apparatus including: a processing chamber in which plural substrates are mounted; a gas supply unit that supplies processing gas into the processing chamber; a gas exhaust unit that exhausts atmospheric gas in the processing chamber; at least a pair of electrodes to which high-frequency power is applied to set the processing gas to an active state; a mount pipe in which each of the pair of electrodes is mounted while at least one place thereof is bent; and a heating unit that is provided to the outside of the processing chamber to heat the atmospheric gas in the processing chamber, wherein each of the electrodes comprises plural internal members formed of a metal or insulating material, a core wire formed of a metal through which the internal members are joined to one another, and ameshed outside member formed of a metal that is provided so as to cover the outer surfaces of the internal members.

According to the present invention, there can be provided a substrate processing apparatus with which electrodes are made to hardly shrink and the quality of processed substrates can be made uniform.

BRIEF DESCRIPTION OF THE DRAWINGS

FIGS. 8A and 8B show an electrode as a comparative example, wherein FIG. 8A is a side view showing the construction of the electrode according to the comparative example, and FIG. 8B is a side view showing a state that shrinkage and distortion occur in the electrode according to the comparative example;

FIGS. 9A to 9C show the electrode according to the comparative example of the present invention, wherein FIG. 9A is a side view of the electrode which is inserted in a mount tube, FIG. 9B is a side view showing the electrode which is made to shrink by the action of gravitational force while the electrode is inserted in the mount tube and FIG. 9C is a side view showing the electrode which shrinks due to the friction between the electrode and the inner wall of the mount tube;

FIG. 10 is a first table showing measurement data of film formed on a substrate at a processing temperature of 470° C.

in the substrate processing apparatus according to the embodiment of the present invention;

FIG. 11 is a second table showing measurement data of film formed on the substrate at a processing temperature of 470° C. in the substrate processing apparatus according to the embodiment of the present invention;

FIG. 12 is a first table showing measurement data of film formed on the substrate at a processing temperature of 545° in the substrate processing apparatus according to the first embodiment of the present invention; and FIG. 13 is a second table showing measurement data of film formed on the substrate at a processing temperature of 545° in the substrate processing apparatus according to the embodiment of the present invention.

DETAILED DESCRIPTION OF THE PREFERRED EMBODIMENTS

Preferred embodiments according to the present invention will be described with reference to the accompanying drawings.

Figure 1:
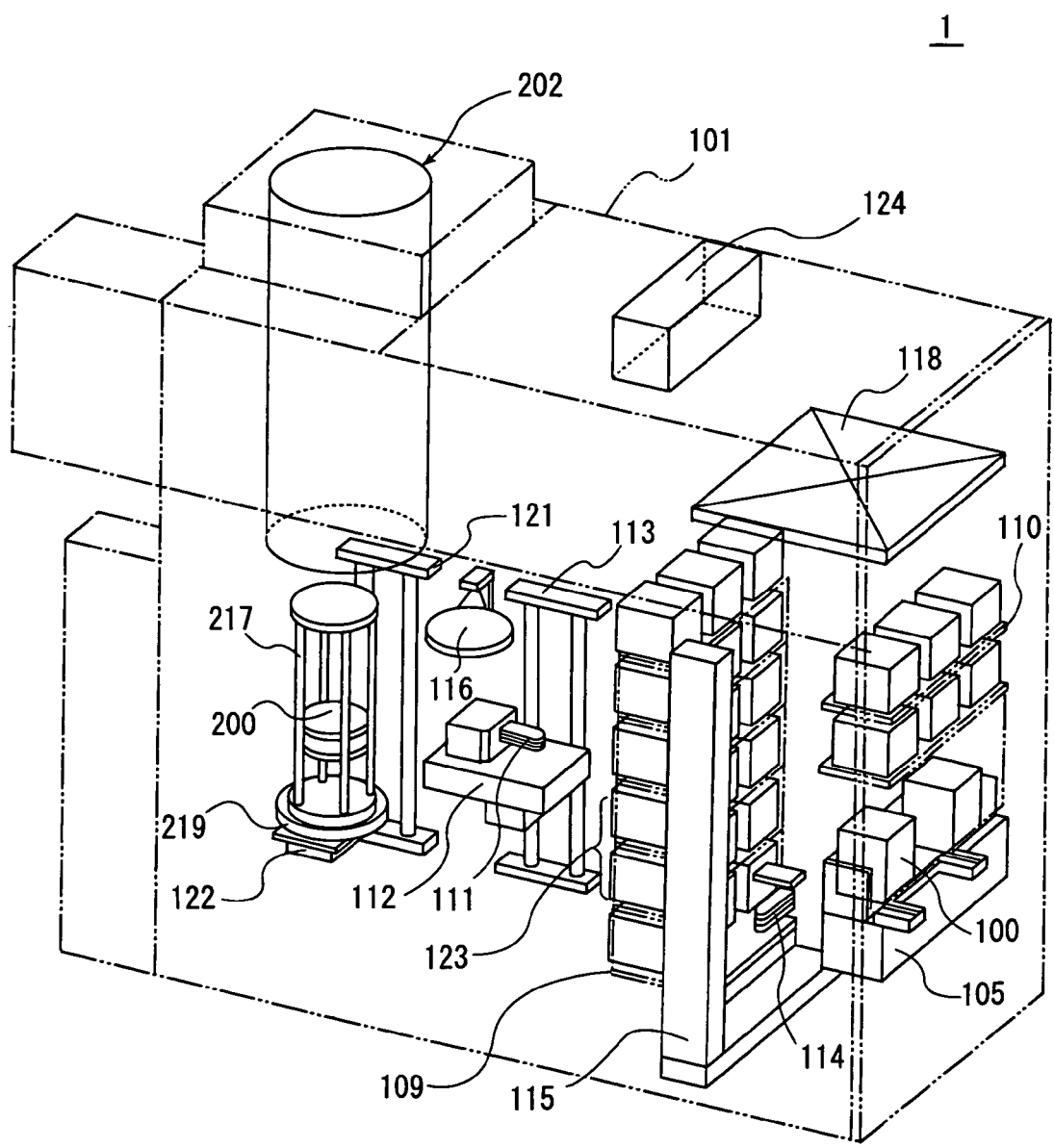
FIG. 1 is a perspective view showing a substrate processing apparatus according to an embodiment of the present invention.
Figure 2:
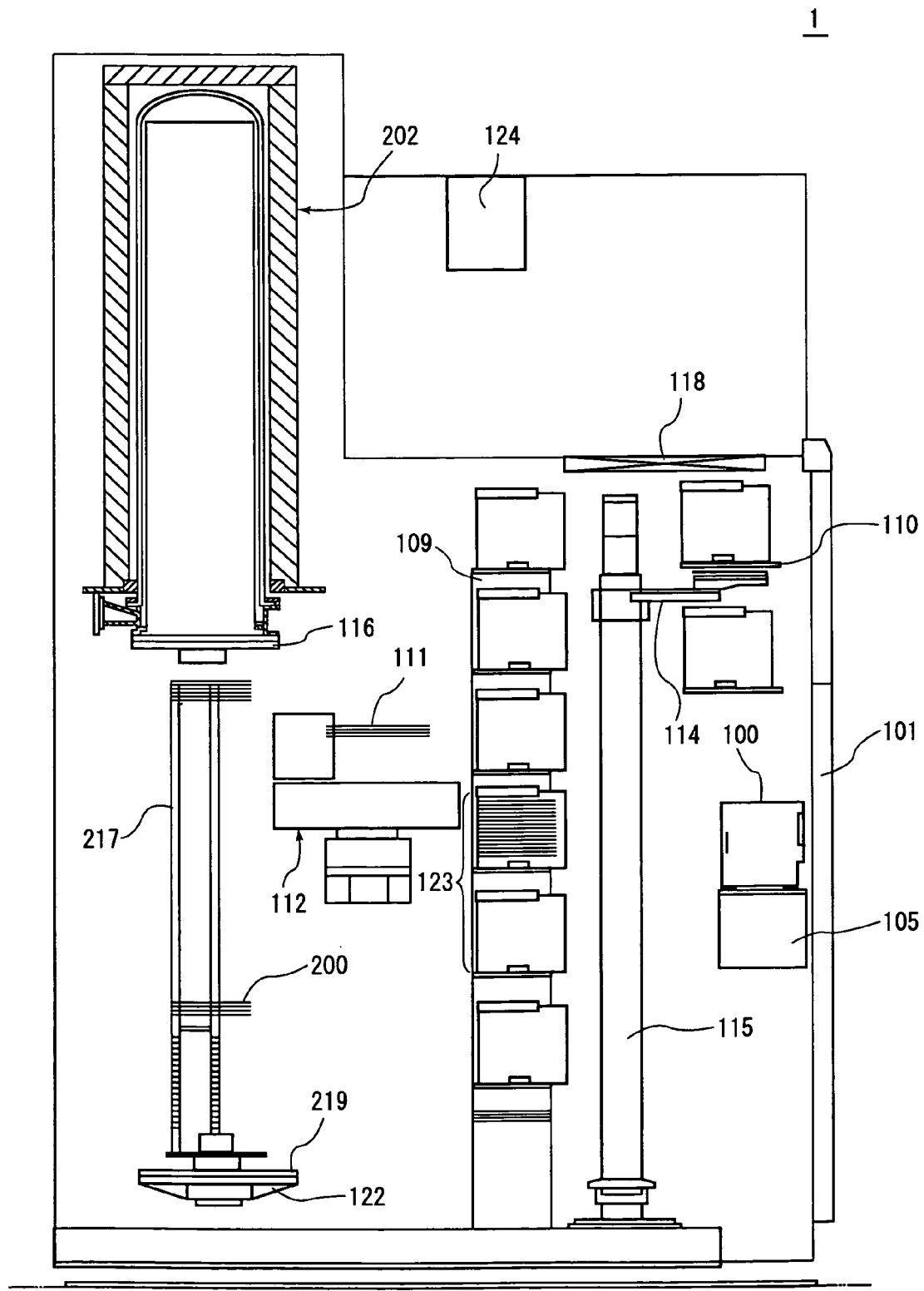
FIG. 2 is a side perspective view showing the substrate processing apparatus according to the embodiment of the present invention.

FIGS. 1 and 2 show a substrate processing apparatus 1 according to an embodiment of the present invention. The substrate processing apparatus 1 is constructed as a semiconductor manufacturing apparatus, and it has a housing 101.

A cassette stage 105 is provided at the front side of the housing 101, and it is used as a hold-member receiving/delivering member that receives/delivers cassettes 100 used as substrate mount containers from/to an external feeding unit. A cassette elevator 115 serving as an elevating unit is provided at the rear side of the cassette stage 105, and a cassette transfer machine 114 as a feeding unit is secured to the cassette elevator 115. Furthermore, cassette shelves 109 used as mount units of the cassettes 100 are provided at the rear side of the cassette elevator 115, and preliminary cassette shelves 110 are provided above the cassette stage 105. A clean unit 118 is provided above the preliminary cassette shelves 110 to make clean air flow through the inside of the housing 101.

A processing furnace 202 is provided at the upper side of the rear portion of the housing 101, and a boat elevator 121 is provided below the processing furnace 202. The boat elevator 121 is used as an elevating unit that elevates a boat 217 serving as a substrate holding unit, and the boat 217 holds wafers 200 used as substrates horizontally in a multistage style. A seal cap 219 as a lid member is secured to the tip portion of the elevating member 122 that is secured to the boat elevator 121, and supports the boat 217 vertically. A transfer elevator 113 used as an elevating unit is provided between the boat elevator 121 and the cassette shelves 109, and a wafer transfer machine 112 used as a substrate feeding unit is secured to the transfer elevator 113. A furnace hole shutter 116 used as a shielding member that has an opening/closing mechanism and closes the lower surface of the processing furnace 202 is provided at a side of the boat elevator 121.

The cassette 100 in which the wafer 200 is loaded is fed from the external feeding device (not shown) onto the cassette stage 105 while the wafer 200 is placed vertically, and then rotated by 90° on the cassette stage 105 so that the wafer 200 takes a horizontal position. Furthermore, the cassette 100 is fed from the cassette stage 105 to the cassette shelf 109 or the preliminary cassette shelf 110 by the cooperation of the elevating/descending and sliding operations of the cassette elevator 115 and the advancing/retracting and rotating operations of the cassette transfer machine 114.

Transfer shelves 123 on which the cassettes 100 as feeding targets of the wafer transfer machine 112 are provided to the cassette shelf 109, and the cassette 100 used to mount and transfer the wafer 200 is transferred to the transfer shelf 123 by the cassette elevator 115 and the cassette transfer machine 114.

When the cassette 100 is transferred to the transfer shelf 123, the wafer 200 is transferred from the transfer shelf 123 to the boat 217 which is being downwardly moved by the cooperation of the advancing/retracting operation and rotating operation of the wafer transfer machine 112 and the elevating/descending operation of the transfer elevator 113.

When a predetermined number of wafers 200 are transferred to the boat 217, the boat 217 is inserted into the processing furnace 202 by the boat elevator 121, and the processing furnace 202 is air-tightly sealed by the seal cap 219. In the air-tightly sealed processing furnace 202, the wafers 200 are heated and processing gas is also supplied into the processing furnace 202 so that the wafers 200 are processed.

When the processing of the wafers 200 is completed, the wafers 200 are transferred from the boat 217 to the transfer shelves 123 in the reverse procedure to the procedure described above, and the cassettes 100 are transferred from the transfer shelves 123 to the cassette stage 105 by the cassette transfer machine 114 and then fed to the outside of the housing 101 by the external feeding unit (not shown). The furnace hole shutter 116 closes the lower surface of the processing furnace 202 when the boat 217 is being downwardly moved, whereby the outside air is prevented from being sucked into the processing furnace 202.

The feeding operation of the cassette transfer machine 114, etc. is controlled by a controller 280 used as a control unit.

Figure 3:
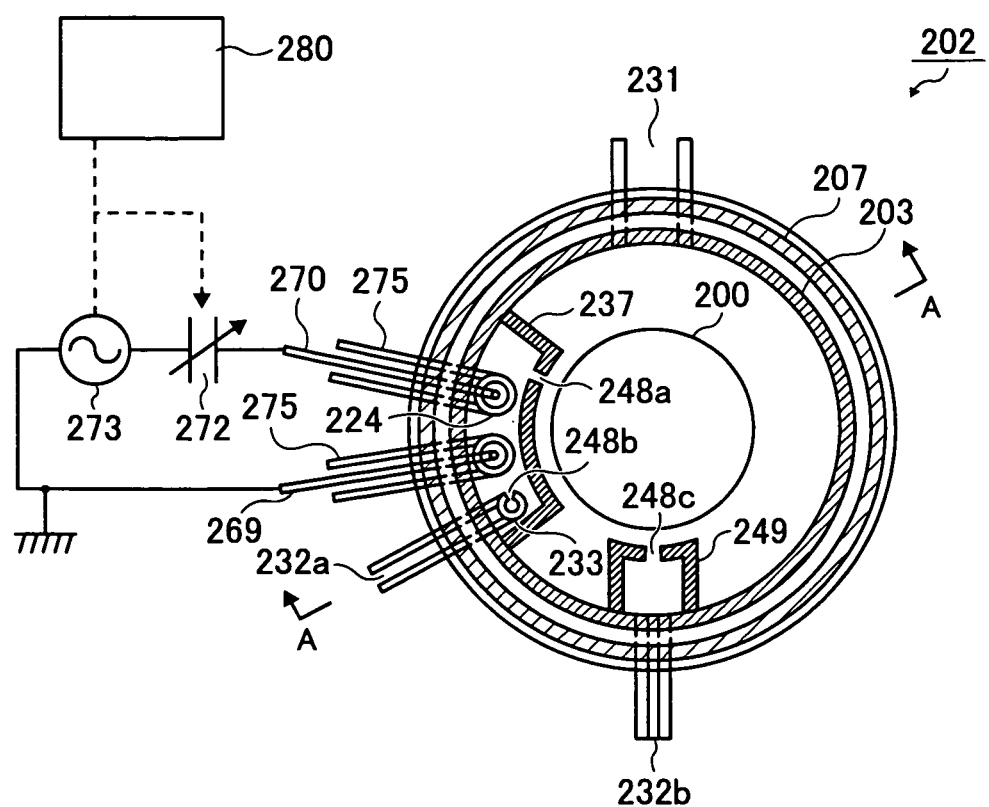
FIG. 3 is a plan view showing a processing furnace of the substrate processing apparatus according to the embodiment of the present invention.
Figure 4:
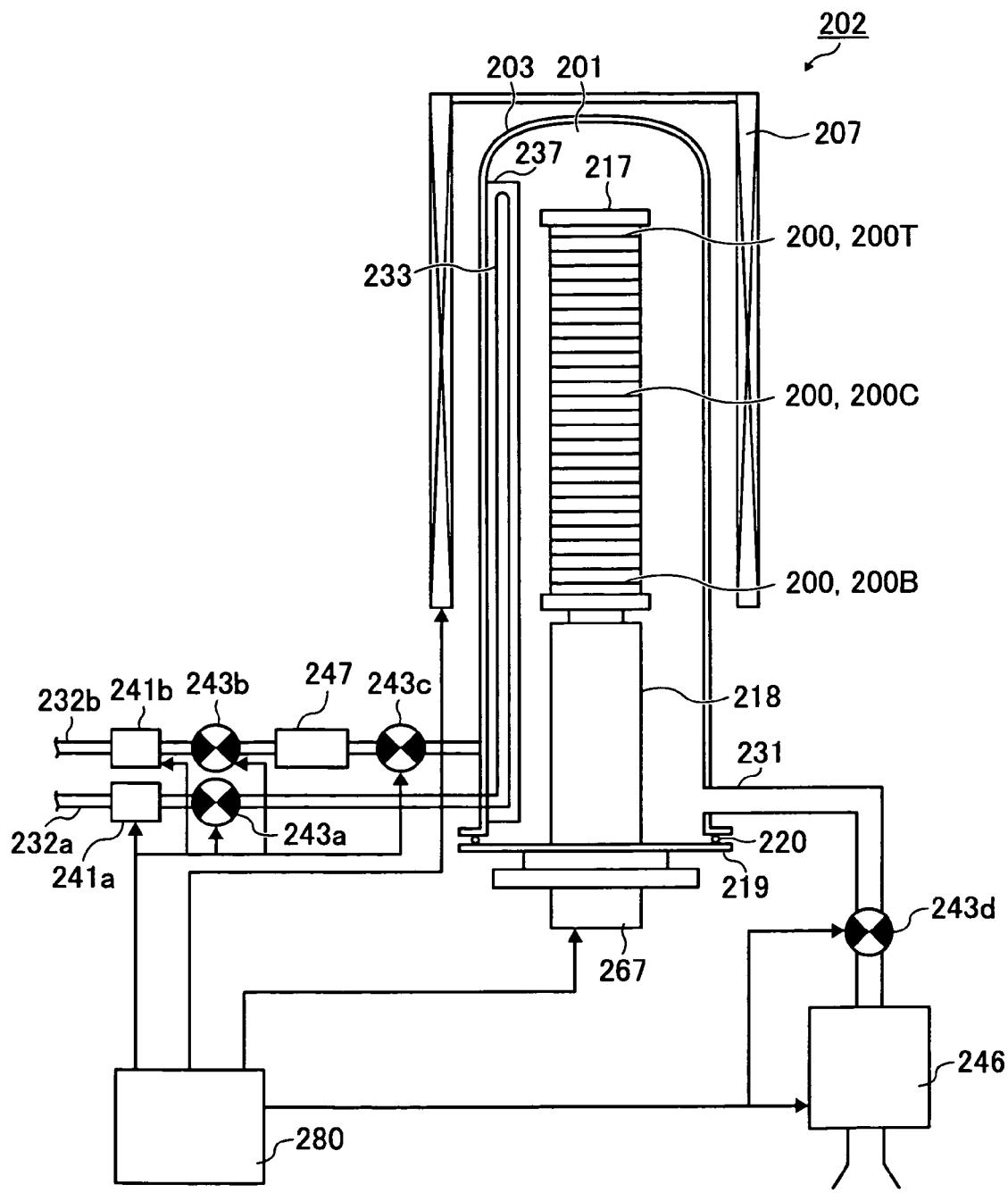
FIG. 4 shows the processing furnace of the substrate processing apparatus according to the embodiment of the present invention, and is a cross-sectional view taken along A-A line in FIG. 3.

FIGS. 3 and 4 show the processing furnace 202.

A heater 207 used as a heating device (heating unit) is provided on the periphery of the processing furnace 202, and a reaction tube 203 used as a reaction container in which the wafers 200 are processed is provided inside the heater 207. The opening at the lower end of the reaction tube 203 is air-tightly sealed through an 0 ring 220 used as an air-tight member by the seal cap 219 used as a lid member, and at least reaction tube 203 and the seal cap 219 constitute a processing chamber 201 in which the wafers 200 are accommodated.

The boat 217 is erected from the seal cap 219 through a boat support table 218, and the boat support table 218 serves as a holding member that holds the boat. The boat 217 is inserted in the processing chamber 201. Plural wafers 200 to be subjected to batch processing are stacked horizontally in a multistage style along the tube axis. Here, in FIG. 4, 200T represents a wafer 200 disposed at the uppermost position out of the wafers 200 stacked in the multistage style. 200B represents a wafer 200 disposed at the lowermost position out of the stacked wafers 200. 200C represents a wafer 200 disposed at the middle position at the equal distance from the wafer 200T and the wafer 200B.

The heater 207 heats the wafers 200 inserted in the processing chamber 201 to a predetermined temperature.

Two gas supply pipes 232a and 232b used as supply passages through which plural (two in this embodiment) kinds of gases are supplied are provided to supply the gases into the processing chamber 201. Reaction gas is supplied from the first gas supply pipe 232a into the processing chamber 201 through a first mass flow controller 241a as a flow rate controller (flow rate control unit), a first valve 243a as an opening/closing valve and also through a buffer chamber 237 formed in the reaction tube 203 described later. Furthermore, reaction gas is supplied from the second gas supply pipe 232b into the processing chamber 201 through a second mass flow controller 241b as a flow rate controller (flow rate control unit), a second valve 243b as an opening/closing valve, a gas pool 247, a third valve 243c as an opening/closing valve and also through a gas supply portion 249 described later.

The two gas supply pipes 232a, 232b, the first mass flow controller 241a, the first valve 243a, the second mass flow controller 241b, the second valve 243b, the gas pool 247, the third valve 243c, the gas supply portion 249, etc. are used as a gas supply unit that supplies the processing gas to the processing chamber 201.

The processing chamber 201 is connected to a vacuum pump 246 through a fourth valve 243d by a gas exhaust pipe 231 that exhausts gas, whereby the processing chamber 201 is exhausted under vacuum. Furthermore, the fourth valve 243d is an opening/closing valve which can perform the vacuum-exhaust of the processing chamber 201 and stop the vacuum-exhaust of the processing chamber 201 by opening/closing the valve, and further can be adjusted in pressure by adjusting the valve opening degree. The gas exhaust pipe 231, the fourth valve 243d, the vacuum pump 246, etc. are used as a gas exhaust unit that exhausts atmospheric gas in the processing chamber 201.

A buffer chamber 237 as a gas dispersing space is provided in an arcuate space between the inner wall of the reaction tube 203 constituting the processing chamber 201 and the waters 200 so as to extend along the stack direction of the wafers 200 from the lower portion to the upper portion of the inner wall of the reaction tube 203. First gas supply holes 248a as supply holes through which gas is supplied are provided to an end portion of the wall of the buffer chamber 237 which is adjacent to the wafers 200. The first gas supply holes 248a are opened to the center of the reaction tube 203. The first gas supply holes 248a each have the same opening area from the lower portion to the upper portion, and have the same opening pitch.

Nozzles 233 are disposed along the stack direction of the wafers 200 from the lower portion of the reaction tube 203 to the upper portion of the reaction tube 203 at the opposite end portion of the buffer chamber 237 to the end portion at which the first gas supply holes 248a are provided. The nozzles 233 are provided with second gas supply holes which are plural supply holes through which gas is supplied. The opening area of the second gas supply holes 248b is set as follows. When the pressure difference between the buffer chamber 237 and the processing chamber 201 is small, the opening area and the opening pitch may be set to be fixed from the upstream side of gas to the downstream side of the gas, and when the pressure difference is large, the opening area may be increased or the opening pitch may be reduced from the upstream side to the downstream side.

In this embodiment, the opening area of the second gas supply holes 248b is gradually increased from the upstream side to the downstream side. With this construction, gas is ejected into the buffer chamber 237 while the flow rate of the gas is different among the respective second gas supply holes 248b, however, the flow amount of the gas is substantially equal among them. After the difference in flow rate of the gas ejected from the respective second gas supply holes 248b is moderated in the buffer chamber 237, the gas is ejected from the first gas supply holes 248a into the processing chamber 201. Accordingly, the gas ejected from each second gas supply hole 248b has uniform flow amount and flow rate when it is ejected from each first gas supply hole 248a.

The buffer chamber 237 is provided with a first electrode 269 and a second electrode 270. The firs electrodes 269 and the second electrode 270 are used as a pair of electrodes to which high-frequency power is applied so that the gas in the processing chamber 201 is set to an active state. The first and second electrodes are designed to be rod-shaped, and accommodated in mount pipes 275 from the upper portion to the lower portion thereof. One of the first electrode 269 and the second electrode 270 is connected to a high-frequency power supply 273 through a matching unit 272, and the other electrode is connected to the earth as a reference potential. As a result, plasma is generated in a plasma generating area 224 between the first electrode 269 and the second electrode 270.

The two mount pipes 275 are used as protection pipes to protect the first electrode 269 and the second electrode 270, and also used as mount pipes in which the first electrode 269 and the second electrode 270 are respectively mounted while a part of each electrode is bent. The mount pipes 275 are configured so that the first electrode 269 and the second electrode 270 can be inserted into the buffer chamber 237 while the first and second electrodes 269 and 270 are isolated from the atmosphere of the buffer chamber 237. Here, when the inner atmosphere of the mount pipes 275 is the same as the outside air (atmospheric air), the first electrode 269 and the second electrode 270 inserted in the mount pipes 275 are oxidized by the heating of the heater 207. Therefore, the apparatus is provided with an inert gas purge mechanism with which the inside of the each mount pipe 275 is filled or purged with inert gas such as nitrogen or the like to suppress the oxygen concentration to a sufficiently low value, thereby preventing oxidation of the first electrode 269 or the second electrode 270.

Furthermore, the gas supply portion 249 is provided on the inner wall of the reaction tube 203 so as to be spaced from the position of the first gas supply holes 248a by an angle of about 120°. The gas supply portion 249 shares the gas supply species with the buffer chamber 237 when plural kinds of gas are alternately supplied to the wafers 200 in a film forming process based on the ALD method.

As in the case of the buffer chamber 237, the gas supply portion 249 has third gas supply holes 248c as supply holes which are disposed to be adjacent to the wafers and supply gas at the same pitch, and a second gas supply pipe 232b is connected to the lower portion thereof.

The opening area and opening pitch of the third gas supply holes 248c may be set to be fixed from the upstream side of the gas to the downstream side of the gas when the pressure difference between the inside of the gas supply portion 249 and the inside of the processing chamber 201 is small, however, the opening area may be increased or the opening pitch may be reduced from the upstream side to the downstream side when the pressure difference is large.

In this embodiment, the opening area of the third gas supply holes 248a is gradually increased from the upstream side to the downstream side.

The boat 217 in which plural wafers 200 in the multistage style so as to be spaced from one another at the same interval is provided at the center portion of the inside of the reaction tube 203, and the boat 217 can enter and leave the reaction tube 203 by a boat elevator mechanism (not shown). A boat rotating mechanism 267 used as a rotating device (rotating unit) that rotates the boat 217 to enhance the uniformity of the processing is provided, and the boat 217 held on a quartz cap 218 is rotated by rotating the boat rotating mechanism 267.

The controller 280 is connected to the first and second mass flow controllers 241a, 241b, the first to fourth valves 243a, 243b, 243c and 243d, the heater 207, the vacuum pump 246, the boat rotating mechanism 267, the boat elevating mechanism (not shown), the high-frequency power supply 273 and the matching unit 272. The controller 280 performs the flow amount adjustment of the first and second mass flow controllers 241a, 241b, the opening/closing operation of the first to third valves 243a, 243b, 243c, the opening/closing and pressure adjusting operations of the fourth valve 243d, the temperature adjustment of the heater 207, the start/stop of the vacuum pump 246, the rotational speed adjustment of the boat rotating mechanism 267, the elevating operation control of the boat elevating mechanism, the power supply control of the high-frequency power supply 273 and the impedance control of the matching unit 272.

In the substrate processing apparatus 1, film formation is performed by the ALD method, and SiN film is formed by using DCS and $NH_3$ gas as one of the semiconductor device manufacturing processes.

The ALD (Atomic Layer Deposition) method adopted when SiN film is formed by using DCS and $NH_3$ gas is one kind of CVD (Chemical Vapor Deposition) method. According to this method, two kinds (or more kinds) of processing gases as raw materials used for film formation are alternately supplied onto the substrate under certain film forming conditions (temperature, time, etc.) while the processing gas is adsorbed onto the substrate by a unit of one atomic layer, and the film formation is performed by using the surface reaction.

With respect to the chemical reaction to be used, for example, in the case of SiN (silicon nitride) film formation, high-quality film formation can be performed at a low temperature of 300 to 600° C. by using DCS ($SiH_2Cl_2$, dichlorsilane) and $NH_3$ (ammonium) according to the ALD method. Furthermore, with respect to gas supply, plural kinds of reaction gases are alternately supplied. The film thickness is controlled on the basis of the number of supply cycles of the reaction gas, and for example when the film forming speed is set to 1 Å/cycle, the 20 cycles of the processing are carried out to form the film thickness.

That is, the wafers 200 which are required to be subjected to film formation are loaded into the boat 217, and fed into the processing chamber 201. Then, after the wafers are fed into the processing chamber 201, the following three steps are successively executed.

In the first step S1, $NH_3$ gas which requires plasma excitation and DCS gas which does not require plasma excitation are made to flow in parallel. First, the first valve 243a provided to the first gas supply pipe 232a and the fourth valve 243d provided to the gas exhaust pipe 231 are opened so that the $NH_3$ gas which is supplied from the first gas supply pipe 232a and adjusted in flow amount by the first mass flow controller 241a is ejected from the second gas supply holes 248b of the nozzle 233 into the buffer chamber 237. High-frequency power is applied between the first electrode 269 and the second electrode 270 from the high-frequency power supply 273 through the matching unit 272 so that $NH_3$ is subjected to plasma excitation, and the plasma-excited $NH_3$ is supplied as active specifies into the processing chamber 201 and exhausted from the gas exhaust pipe 231.

When the $NH_3$ gas is plasma-excited and made to flow as active specifies, the fourth valve 243d is properly adjusted to keep the internal pressure of the processing chamber 201 in the range from 10 to 100 Pa. The supply flow amount of $NH_3$ to be controlled by the first mass flow controller 241a is supplied in the range from 1 to 10 slm. The time for which the wafers 200 are exposed to the active specifies obtained by the plasma-excitation of $NH_3$ is set in the range from 2 to 120 seconds. At this time, the temperature of the heater 207 is set so that the wafers are kept in the range from 300 to 600°. The reaction temperature of $NH_3$ is high, and thus $NH_3$ does not induce any reaction under the wafer temperature described above. Accordingly, $NH_3$ is supplied as active specifies by the plasma excitation, and thus the wafer temperature may be kept in the set low temperature range.

When $NH_3$ is plasma-excited and supplied as active specifies, the second valve 243b at the upstream side of the second gas supply pipe 232b is opened and the third valve 243c at the downstream side is closed so that DCS also flows. Accordingly, DCS is stocked in the gas pool 247 provided between the second and third valves 243b and 243c. At this time, gas flowing in the processing chamber 201 is the active specifies obtained by plasma-excited $NH_3$, and thus no DCS exists in the processing chamber 201. Accordingly, $NH_3$ does not induce gas reaction, and $NH_3$ which becomes the plasma-excited active specifies is subjected to surface reaction (chemical adsorption) with a surface portion such as base film or the like on each wafer 200.

In the next step 2, the first valve 243a of the first gas supply pipe 232a is closed to stop the supply of $NH_3$, however, the supply of DCS into the gas pool 247 is continued. Also when a predetermined amount of DCS under a predetermined pressure is stocked in the gas pool 247, the second valve 243b at the upstream side is closed to trap DCS in the gas pool 247. Furthermore, the fourth valve 243d of the gas exhaust pipe 231 is kept open, and the processing chamber 201 is exhausted to be set to 20 Pa or less in pressure by the vacuum pump 246, whereby residual $NH_3$ is excluded from the processing chamber 201. Furthermore, at this time, when inert gas such as $N_2$ or the like is supplied to the processing chamber 201, the effect of excluding the residual $NH_3$ is enhanced.

DCS is stocked in the gas pool 247 so that the pressure is equal to 20000 Pa or more. The apparatus is configured so that the conductance between the gas pool 247 and the processing chamber 201 is equal to $1.5 \times 10^{-3} m^3/s$ or more. With respect to the ratio between the volume of the reaction tube 203 and the volume of the gas pool 247 required for this reaction pipe 203, when the volume of the reaction tube 203 is equal to 100l (liter), the volume of the gas pool 247 is preferably 100 to 300 cc, and thus the volume ratio of the gas pool 247 to the reaction chamber is preferably 1/1000 to 3/1000.

In the last step 3, when the exhaust of the processing chamber 201 is finished, the fourth valve 243d of the gas exhaust pipe 231 is closed to stop the exhaust, and the third valve 243c at the downstream side of the second gas supply pipe 232b is opened, whereby DCS stocked in the gas pool 247 is supplied into the processing chamber 201 at a burst. At this time, since the fourth valve 243d of the gas exhaust pipe 231 is in a closed state, the pressure in the processing chamber 201 rapidly increases up to about 931 Pa (7 Torr). The DC supply time is set to about 2 to 4 seconds, and the time for exposure to the increasing pressure atmosphere is set to 2 to 4 seconds, totally 6 seconds.

At this time, the temperature of the wafers is kept to a desired temperature in the range from 300 to 600° similarly to the time when $NH_3$ is supplied. By supplying DCS, DCS and $NH_3$ which is chemically adsorbed onto the surface of the wafer 200 induce the surface reaction (chemical adsorption) to form SiN film on the wafer 200. After the film formation, the third valve 243c is closed and the fourth valve 243c is opened to vacuum-exhaust the processing chamber 201, whereby the residual gas which was left after contribution to the film formation is excluded. At this time, when inert gas such as $N_2$ or the like is supplied to the processing chamber 201, the effect of excluding from the processing chamber 201 the residual gas which was left after contribution to the film formation of the DCS can be further enhanced. Furthermore, the second valve 243b is opened, and the supply of DCS to the gas pool 247 is started.

The steps 1 to 3 described above constitute one cycle, and this cycle is repeated at plural times to form SiN film having a predetermined film thickness on each wafer.

In the ALD apparatus, gas is chemically adsorbed onto the surface portion of the wafer 200. The adsorption amount of the gas is proportional to the pressure of the gas and the exposure time to the gas. Accordingly, in order to make a desired constant amount of gas adsorbed onto the wafer in a short time, it is required to increase the pressure of the gas in a short time. According to this embodiment, DCS stocked in the gas pool 247 is instantaneously supplied while the fourth valve 243d is closed, so that the pressure of DCS in the processing chamber 201 can be rapidly increased, and the desired constant amount of gas can be instantaneously adsorbed onto the wafer.

In this embodiment, the step of plasma-exciting $NH_3$ gas and supplying the plasma-excited $NH_3$ gas as active species and the step of exhausting the processing chamber 201 which are required in the ALD method are executed while DCS is stocked in the gas pool 247. Therefore, no specific step of pooling DCS is required. Furthermore, the inside of the processing chamber 201 is exhausted to remove $NH_3$ gas, and then DCS is made to flow into the processing chamber 201. Therefore, the $NH_3$ gas and DCS do not react with each other while being supplied to the water 200. DCS supplied to the processing chamber is enabled to effectively react only with $NH_3$ having been adsorbed on the wafer 200.

Figure 5:
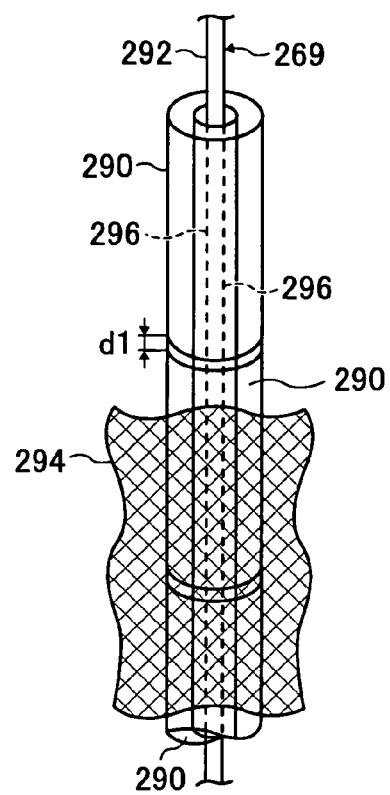
FIG. 5 is a perspective view showing the construction of an electrode of the substrate processing apparatus according to the embodiment of the present invention.
Figure 6:
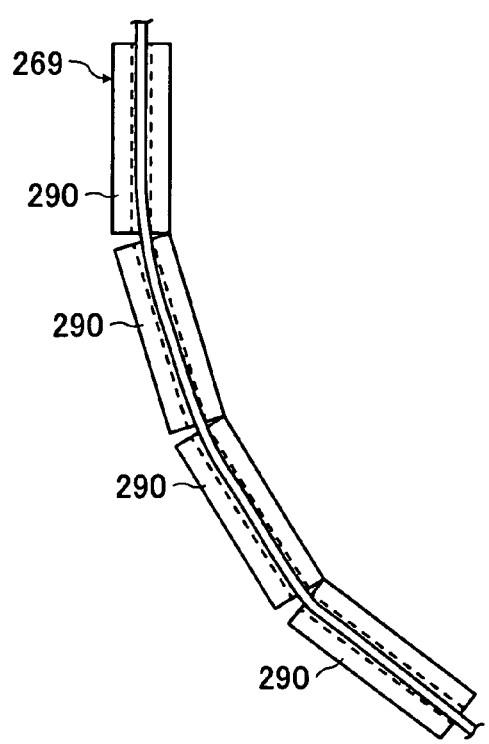
FIG. 6 is a side view showing a state that the electrode of the substrate processing apparatus according to the embodiment of the present invention is bent.

FIGS. 5 and 6 show the first electrode 269.

The first electrode 269 will be described hereunder. The construction of the second electrode 270 is identical to the first electrode 269.

As shown in FIG. 5, the first electrode 269 has plural short pipes 290, a core wire 292 and a meshed member 294. The plural short pipes 290 are joined to one another so as to be bendable through the core wire 292. The short pipes 290 are used as pipe bodies which are less deformed by heat as compared with the core wire 292, and also used as inner members formed of metal or insulating materials. The short pipes 290 are less thermally deformed as compared with the core wire 292, and formed of materials having certain a diathermancy and rigidity. For example, high-purity alumina, Ni (nickel) or the like may be used as a specific material thereof. When alumina or the like is used, there is the possibility that pollution by Al or the like occurs, and thus quartz is more preferably used in a semiconductor manufacturing apparatus. Each of the short pipes 290 has a substantially cylindrical shape, and a through hole 296 is formed so as to penetrate through the short pipe 290 in the longitudinal direction.

The core wire 292 is formed of a metal and is used to join the plural short pipes 290 to one another bendably by penetrating through the through holes 296 formed in the plural short pipes 290. The core wire 292 is plastically deformable so as to secure bending, and more specifically a wire containing Ni (nickel) mainly is used. When the plural short pipes 290 are joined to one another by using the core wire 292, a fixed interval d1 is set between the neighboring short pipes 290.

The meshed member 294 is used as a mesh-like external member which is formed of a metal and provided so as to cover the outer surfaces of the plural short pipes 290, and it is designed so that fine wires formed of Ni mainly are netted, for example. The meshed member 294 is formed of fine wires and has flexibility, so that it is deformable. Therefore, the meshed member 294 is disposed so as to cover the outer surfaces of the plural short pipes 290 by deformation. For convenience of description, it is illustrated in FIG. 5 as if the meshed member 294 covers only the outer peripheral surfaces of the short pipe 290 located at the second position from the upper side and the short pipe 290 located at the third position from the upper side. However, the meshed member 294 is provided so as to cover the outer peripheral surfaces of all the short pipes 290 from the short pipe 290 located at one end side to the short pipe 290 located at the other end side.

As described above, the first electrode 269 is designed so that the plural short pipes 290 are joined to one another so as to have an interval d between the respective neighboring short pipes 290, and the meshed member covering the outer peripheral surfaces of the plural short pipes 290 is formed of the netted fine wires so as to be deformable. Therefore, the first electrode 269 can be kept bent as shown in FIG. 6. Therefore, even when the mount pipe 275 (see FIG. 3) is bent, the first electrode 269 is deformable along the inner wall of the bent mount pipe 275. Furthermore, one end side of the first electrode 269 is inserted into the mount pipe 275, and the other end side of the first electrode 269 is pressed, whereby the first electrode 269 can be inserted into the mount pipe 275 along the bent mount pipe 275.

The plural short pipes 290 constituting the first electrode 269 are less thermally deformed as compared with the core wire 292, and have a certain rigidity, so that even when the interval d between the neighboring short pipes 290 is shortened the length of each of the short pipes 290 is not varied. Therefore, for example when the first electrode 269 is inserted into the mount pipe 275, it does not greatly shrink in the longitudinal direction. Therefore, there is no case where the first electrode 269 does not reach a place such as the tip side of the mount pipe 275 or the like at which the first electrode 269 should be originally located because the first electrode 269 shrinks, and thus there hardly occurs such a case that the concentration of plasma generated at the place concerned is lower than originally expected.

Figure 7:
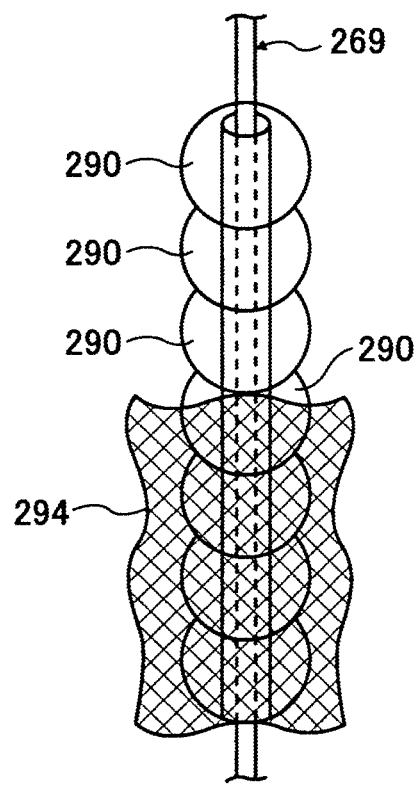
FIG. 7 is a perspective view showing a modification of the electrode of the substrate processing apparatus according to the embodiment of the present invention.

FIG. 7 shows a modification of the first electrode 269.

The first electrode 269 will be described hereunder, and an electrode according to the following modification may be used as the second electrode 270.

In the first electrode 269 described above, the plural short pies 290 are designed in a substantially cylindrical shape. However, this modification uses substantially spherical short pipes 290. In the first electrode 269 according to this modification, a pipe through hole is formed in each of the short pipes 290, and a core wire 292 is inserted in the through holes 296 so that the plural short pipes 290 are joined to one another. Furthermore, a meshed member 294 is provided so as to cover the outer periphery of the plural short pipes 290.

FIG. 8 shows the first electrode 269 according to a comparative example.

Figure 8A:
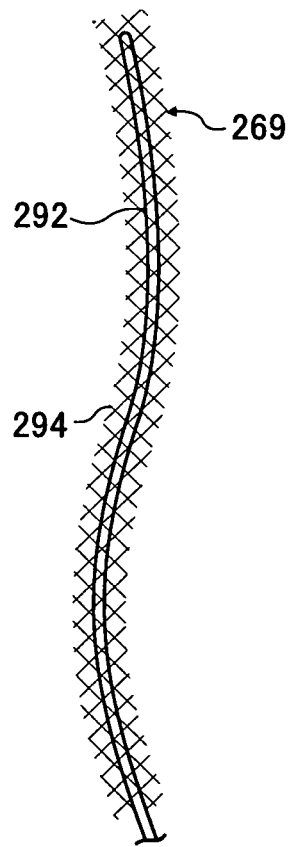

Each of the first electrode 269 used in the first embodiment and the first electrode used in the modification each have the plural short pipes 290, the core wire 292 and the meshed member 294. On the other hand, the first electrode according to this comparative example has no short pipe 290, and the core wire 292 is directly covered by the meshed member 294 as shown in FIG. 8A. Accordingly, when heated, the core wire 292 is directly heated without any short pipe 290 having the heat insulating effect. Therefore, as shown at the right side of FIG. 8B, the core wire 292 is liable to shrink on warp due to heat.

Figure 8B:
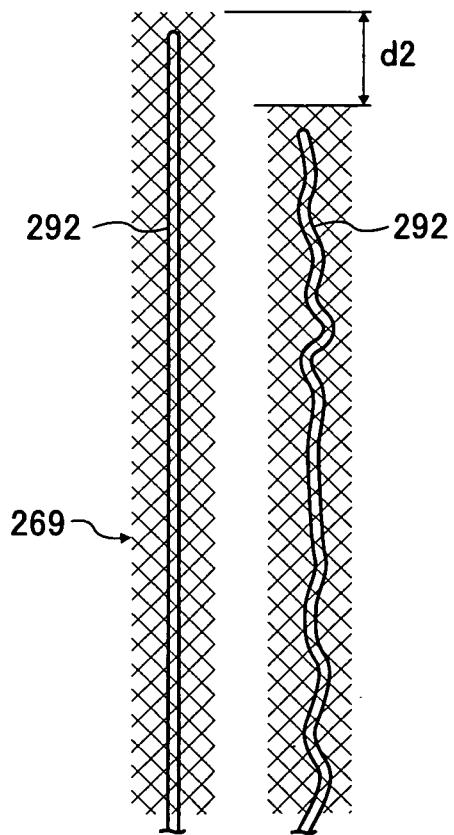

FIG. 8B shows a state that the core wire 292 shrinks and warps due to heat and thus the length of the first electrode is shortened by the length d2.

Figure 9A:
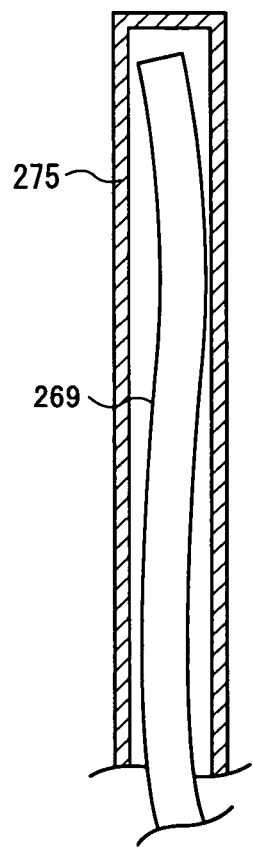
Figure 9B:
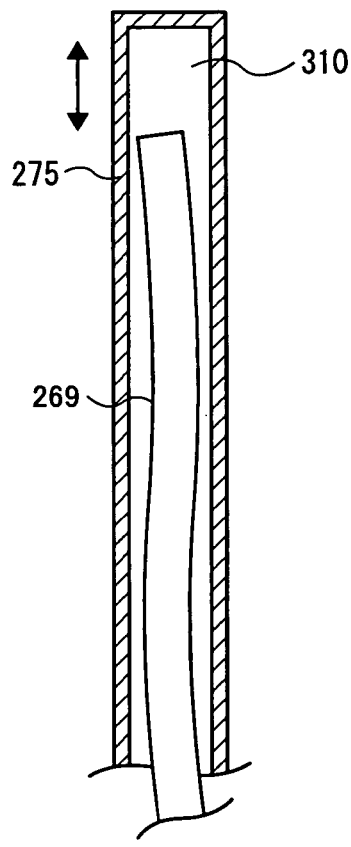
Figure 9C:
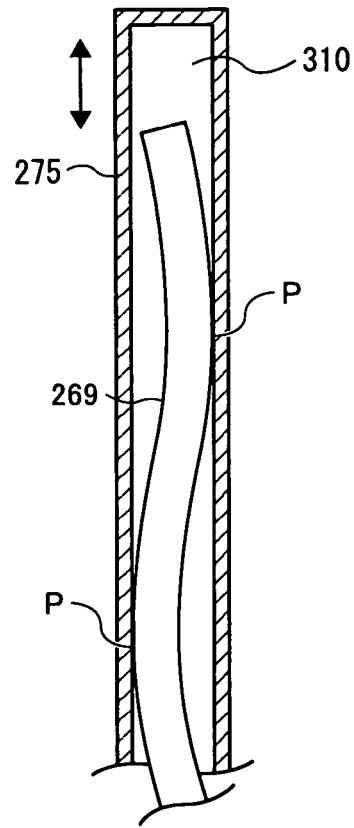

FIG. 9 shows the first electrode 269 according to the comparative example mounted in the mount pipe 275. Originally, the first electrode 269 is to reach the neighborhood of the upper end portion of the mount pipe 275 as shown in FIG. 9A. However, when the first electrode 269 shrinks because the interval between the fine wires constituting the meshed member 294 is reduced due to their own weights or the like, for example, a space 310 in which no first electrode 269 exists is formed at a place at which the first electrode 269 should be originally located. In this case, the concentration of plasma generated in the space 310 becomes lower compared to the case where the first electrode 269 exists in the space 310.

In addition to the situation that the first electrode 260 shrinks due to its own weight as shown in FIG. 9B, the first electrode 269 may shrink because the first electrode 269 comes into contact with the inner wall of the mount pipe 275 at a position P when the first electrode 269 is inserted into the mount pipe 275, and thus the interval of the fine wires constituting the meshed member 294 is reduced due to friction or the like, for example. Also in this case, a space 310 in which no first electrode exists is formed at the end portion of the mount pipe 275.

The first electrode 269 only has to include a core wire 292 and plural core pipes 290 which are bendable by the core wire 292 and less thermally deformed due to heat as compared with the core wire 292, the shape variation of the core wire 292 due to heat being suppressed. Accordingly, in place of the structure that the core wire 292 penetrates through the short pipes 290 and the meshed member 294 having electrical conductivity is wound around the short pipes 290 as in the case of the first electrode 269 of the first embodiment and the first electrode 269 of the modification described above, the short pipes themselves 290 may be formed of an electrically conductive material such as a metal or the like to thereby omit the meshed member 294.

FIG. 10 shows measurement data of films formed on the wafers 200 at the processing temperature of 470° C. for every electrode type being used and every position at which the wafer 200 is disposed in the processing chamber 201. The measurement data shown in FIG. 10 include the thickness of the film formed on the wafer 200, in-plane uniformity and inter-plane uniformity. Here, the in-plane uniformity means the uniformity of the film thickness at every position in one wafer 200. The inter-plane uniformity means the uniformity in film thickness among films formed on plural wafers 200 disposed at different positions in the processing chamber 201, for example, at the upper portion, the center portion and the lower side in the processing chamber 201 or the like.

Furthermore, in FIG. 10, the upper portion, the center portion and the lower portion are shown as the positions at which the wafers 200 are disposed. Here, the upper portion means the position at which the uppermost wafer 200T is disposed in the processing chamber 201 (see FIG. 4). The lower portion means the position at which the lower most wafer 200B is disposed in the processing chamber 201 (see FIG. 4). The center portion means the position at which the wafer 200C which is spaced from both the wafer 200T and the wafer 200B by a substantially equal distance is disposed (see FIG. 4).

From the measurement result shown in FIG. 10, it is seen that at whichever position the wafer 200 is disposed in the processing chamber 201, the in-plane film thickness uniformity is most excellent when the material of the short pipes is quartz in the first electrode 269 and the second electrode 270, it is secondly excellent when the material of the short pipes is Ni in the first and second electrodes 269 and 270, and the in-plane film thickness uniformity is worst when the first and second electrodes 269 and 270 have no short pipe.

Specifically, when the wafer 200 is disposed at the upper side in the processing chamber 201 and the short pipes formed of quartz are used in the first and second electrodes 269 and 270, the in-plane uniformity is equal to 0.88%. Furthermore, when the wafer 200 is disposed at the upper side in the processing chamber 201 and the short pipes formed of Ni are used in the first and second electrodes 269 and 270, the in-plane uniformity is equal to 1.02%. Still furthermore, when the wafer 200 is disposed at the upper side in the processing chamber 201 and no short pipe is provided in the first and second electrodes 269 and 270, the in-plane uniformity is equal to 1.19%.

As described above, in the case where the wafer 200 is disposed at the upper side in the processing chamber 201, the in-plane film thickness uniformity is best when the electrodes having the short pipes formed of quartz are used as the first and second electrodes 269 and 270, secondly best when the electrodes having the short pipes formed of Ni are used as the first and second electrodes 269 and 270, and worst when the electrodes having no short pipe are used as the first and second electrodes 269 and 270.

Next, when the wafer 200 is disposed at the center portion in the processing chamber 201 and the electrodes having the short pipes formed of quartz are used as the first and second electrodes 269 and 270, the in-plane uniformity is equal to 1.41%. When the wafer 200 is disposed at the center portion in the processing chamber 201 and the electrodes having the short pipes formed of Ni are used as the first and second electrodes 269 and 270, the in-plane uniformity is equal to 1.56%. When the wafer 200 is disposed at the center portion in the processing chamber 201 and the electrodes having no short pipe are used as the first and second electrodes 269 and 270, the in-plane uniformity is equal to 1.61%.

As described above, in the case where the wafer 200 is disposed at the center portion in the processing chamber 201, the in-plane film thickness uniformity is best when the electrodes having the short pipes formed of quartz are used as the first and second electrodes 269 and 270, secondly best when the electrodes having the short pipes formed of Ni are used as the first and second electrodes 269 and 270, and worst when the electrodes having no short pipe are used as the first and second electrodes 269 and 270.

Next, when the wafer 200 is disposed at the lower side in the processing chamber 201 and the electrodes having the short pipes formed of quartz are used as the first and second electrodes 269 and 270, the in-plane uniformity is equal to 1.47%. When the wafer 200 is disposed at the lower side in the processing chamber 201 and the electrodes having the short pipes formed of Ni are used as the first and second electrodes 269 and 270, the in-plane uniformity is equal to 1.60%. Furthermore, when the wafer 200 is disposed at the lower side in the processing chamber 201 and the electrodes having no short pipe are used as the first and second electrodes 269 and 270, the in-plane uniformity is equal to 1.63%. As describedabove, in the case where the wafer 200 is disposed at the lower side in the processing chamber 201, the in-plane film thickness uniformity is best when the electrodes having the short pipes formed of quartz are used as the first and second electrodes 269 and 270, secondly best when the first and second electrodes 269 and 270 have the short pipes formed of Ni are used as the first and second electrodes 269 and 270, and worst when the electrodes having no short pipe are used as the first and second electrodes 269 and 270.

From the measurement result shown in FIG. 10, it is seen that at whichever position the wafer 200 is disposed in the processing chamber 201, the thickness of the film formed on the wafer 200 is largest when the electrodes having the short pipes formed of quartz are used as the first and second electrodes 269 and 270, secondly largest when the electrodes having the short pipes formed of Ni are used as the first and second electrodes 269 and 270, and smallest when the electrodes having no short pipe are used as the first and second electrodes 269 and 270.

Specifically, in the case where the wafer 200 is disposed at the upper side in the processing chamber 201, the film thickness of the formed film is equal to 390.37 Å when the electrodes having the short pipes formed of quartz are used as the first and second electrodes 269 and 270. Furthermore, when the wafer 200 is disposed at the upper side in the processing chamber 201 and the electrodes having the short pipes formed of Ni are used as the first and second electrodes 269 and 270, the film thickness of the formed film is equal to 385.58 Å. Furthermore, when the wafer 200 is disposed at the upper side in the processing chamber 201 and the electrodes having no short pipe are used as the first and second electrodes 269 and 270, the film thickness of the formed film is equal to 382.08 Å.

As described above, in the case where the wafer 200 is disposed at the upper side in the processing chamber 201, the film thickness of the film formed on the wafer 200 is largest when the electrodes having the short pipes formed of quartz are used as the- first and second electrodes 269 and 270, secondly largest when the electrodes having the short pipes formed of Ni are used as the first and second electrodes 269 and 270, and smallest when the electrodes having no short pipe are used as the first and second electrodes 269 and 270.

Next, in the case where the wafer 200 is disposed at the center portion in the processing chamber 201, the film thickness of the formed film is equal to 399.69 Å when the first and second electrodes 269 and 270 have the short pipes formed of quartz. When the wafer 200 is disposed at the center portion in the processing chamber 201 and the electrodes having the short pipes of Ni are used as the first and second electrodes 269 and 270, the film thickness of the formed film is equal to 395.52 Å. Furthermore, when the wafer 200 is disposed at the center portion in the processing chamber 201 and the electrodes having no short pipe are used as the first and second electrodes 269 and 270, the film thickness of the formed film is equal to 393.55 Å.

As described above, in the case where the wafer 200 is disposed at the center portion in the processing chamber 201, the film thickness of the formed film is largest when the electrodes having the short pipes formed of quartz are used as the first and second electrodes 269 and 270, secondly largest when the electrodes having the short pipes formed of Ni are used as the first and second electrodes 269 and 270, and smallest when the electrodes having no short pipe are used as the first and second electrodes 269 and 270.

Next, in the case where the wafer 200 is disposed at the lower side in the processing chamber 201, the film thickness of the formed film is equal to 401.57 Å when the first and second electrodes 269 and 270 have the short pipes formed of quartz. When the wafer 200 is disposed at the lower side in the processing chamber 201 and the first and second electrodes 269 and 270 have the short pipes formed of Ni, the film thickness of the formed film is equal to 396.11 Å. Furthermore, when the wafer 200 is disposed at the lower side in the processing chamber 201 and the first and second electrodes 269 and 270 have no short pipe, the film thickness of the formed film is equal to 393.82 Å.

As described above, in the case where the wafer 200 is disposed at the lower side in the processing chamber 201, the film thickness of the film formed on the wafer 200 is largest when the first and second electrodes 269 and 270 have the short pipes formed of quartz, secondly largest when the first and second electrodes have the short pipes formed of Ni, and smallest when the first and second electrodes 269 and 270 have no short pipe.

Furthermore, from the measurement result shown in FIG. 10, it is apparent that the inter-plane uniformity is more enhanced when the electrodes having the short pipes 290 formed of any one of Ni and quartz are used as the first and second electrodes 269 and 270 as compared with the case where the electrodes having no short pipe are used as the first and second electrodes 269 and 270.

Specifically, when the electrodes having no short pipe 290 are used as the first and second electrodes 269 and 270, the inter-plane is equal to 1.506%. When the electrodes having the short pipes formed of quart are used as the first and second electrodes 269 and 270, the inter-plane uniformity is equal to 1.409%. Furthermore, when the electrodes having the short pipes formed of Ni are used as the first and second electrodes 269 and 270, the inter-plane uniformity is equal to 1.341%.

As described above, as compared with the case where the electrodes having no short pipe 290 are used as the first and second electrodes 269 and 270, the inter-plane uniformity is more enhanced when the electrodes having the short pipes 290 formed of any one of Ni and quartz are used as the first and second electrodes 269 and 270.

In FIG. 11, the measurement data of the films which are formed on the wafers 200 at the processing temperature of 470° C. are shown for every electrode type being used, every position at which the wafer 200 is disposed in the processing chamber and every position in the wafer 200.

The measurement data shown in FIG. 11 correspond to the variation rate on a peripheral-direction basis in the film formed on the wafer 200. Here, the variation rate on a peripheral-direction base means the inter-plane uniformity for every distance from the center of the wafer 200. In FIG. 11, the position at which the variation rate for each peripheral direction is measured is set to be the center position, a position 1, a position 2 and a position 3. Here, the distance from the center of the wafer 200 is large in the order of the position 1, the position 2 and the position 3.

As shown in FIG. 11, it is apparent that the variation rate for each peripheral direction is smaller when the first and second electrodes 269 and 270 have the short pipes formed of Ni as compared with the case where the first and second electrodes 269 and 270 have the short pipes formed of quartz at whichever place the wafer 200 is disposed in the processing chamber and whichever peripheral direction of the wafer 200 it is.

In FIG. 12, the measurement data of the films which are formed on the wafers 200 at the processing temperature of 545° C. are shown for every electrode type being used and every position at which the wafer 200 is disposed in the processing chamber 201. The measurement data shown in FIG. 12 concern the thickness of the film formed on the wafer 200, the in-plane uniformity and the inter-plane uniformity. The upper side, the center portion and the lower side in FIG. 12 are the same as shown in FIG. 10.

When the processing temperature is equal to 545° C., as in the case of the processing temperature of 470° C., it is apparent from the measurement result shown in FIG. 12 that irrespective of the locating position of the wafer 200 in the processing chamber 201, the in-plane film thickness uniformity is best when the electrodes having the short pipes formed of quart are used as the first and second electrodes 269 and 270, secondly best when the electrodes having the short pipes formed of Ni are used as the first and second electrodes 269 and 270, and worst when the electrodes having no short pipe are used as the first and second electrodes 269 and 270.

Specifically, in the case where the processing temperature is equal to 545° C. and the wafer 200 is disposed at the upper side in the processing chamber 201, the in-plane uniformity is equal to 0.95% when the electrodes having the short pipes formed of quart are used as the first and second electrodes 269 and 270, is equal to 1.10% when the electrodes having the short pipes formed of Ni are used as the first and second electrodes 269 and 270, and is equal to 1.24% when the electrodes having no short pipe are used as the first and second electrodes 169 and 270.

Next, in the case where the processing temperature is equal to 545° C. and the wafer 200 is disposed at the center portion in the processing chamber 201, the in-plane uniformity is equal to 1.45% when the electrodes having the short pipes formed of quartz are used as the first and second electrodes 269 and 270, is equal to 1.61% when the electrodes having the short pipes formed of Ni are used as the first and second electrodes 269 and 270, and is equal to 1.70% when the electrodes having no short pipe are used as the first and second electrodes 269 and 270.

Next, in the case where the processing temperature is equal to 545° C. and the wafer 200 is disposed at the lower side in the processing chamber 201, the in-plane uniformity is equal to 1.61% when the electrodes having the short pipes formed of quartz are used as the first and second electrodes 269 and 270, is equal to 1.69% when the electrodes having the short pipes formed of Ni are used as the first and second electrodes 269 and 270, and is equal to 1.77% when the electrodes having no short pipe are used as the first and second electrodes 269 and 270.

When the processing temperature is equal to 545° C., as in the case of the processing temperature of 470° C., irrespective of the position at which the wafer 200 is disposed in the processing chamber 201, the in-plane film thickness uniformity is best when the electrodes having the short pipes formed of quartz are used as the first and second electrodes 269 and 270, secondly best when the electrodes having the short pipes formed of Ni are used as the first and second electrodes 269 and 270, and worst when the electrodes having no short pipe are used as the first and second electrodes 269 and 270.

When the processing temperature is equal to 545° C., as in the case of the processing temperature of 470° C., it is apparent from the measurement result shown in FIG. 12 that irrespective of the position at which the wafer 200 is disposed in the processing chamber 201, the thickness of the film formed on the wafer 200 is largest when the electrodes having the short pipes formed of quartz are used as the first and second electrodes 269 and 270, secondly largest when the electrodes having the short pipes formed of Ni are used as the first and second electrodes 269 and 270, and smallest when the electrodes having no short pipe are used as the first and second electrodes 269 and 270.

Specifically, in the case where the processing temperature is equal to 545° C. and the wafer 200 is disposed at the upper side in the processing chamber 201, the thickness of the formed film is equal to 377.10 Å when the electrodes having the short pipes formed of quartz are used as the first and second electrodes 269 and 270. The thickness of the formed film is equal to 371.98 Å when the electrodes having the short pipes formed of Ni are used as the first and second electrodes 269 and 270. The thickness of the formed film is equal to 370.39 Å when the electrodes having no short pipe are used as the first and second electrodes 269 and 270.

Next, in the case where the processing temperature is equal to 545° C. and the wafer 200 is disposed at the center portion in the processing chamber 201, the thickness of the formed film is equal to 381.28 Å when the electrodes having the short pipes formed of quartz are used as the first and second electrodes 269 and 270. The thickness of the formed film is equal to 377.51 Å when the electrodes having the short pipes formed of Ni are used as the first and second electrodes 269 and 270. The thickness of the formed film is equal to 37.15 Å when the electrodes having no short pipe are used as the first and second electrodes 269 and 270.

Next, in the case where the processing temperature is equal to 545° C. and the wafer 200 is disposed at the lower side in the processing chamber 201, the thickness of the formed film is equal to 379.78 Å when the electrodes having the short pipes formed of quartz are used as the first and second electrodes 269 and 270. The thickness of the formed film is equal to 375.13 Å when the electrodes having the short pipes formed of Ni are used as the first and second electrodes 269 and 270. The thickness of the formed film is equal to 374.98 Å when the electrodes having no short pipe are used as the first and second electrodes 269 and 270.

As described above, also when the processing temperature is equal to 545° C., as in the case of the processing temperature of 470°, irrespective of the position at which the wafer 200 is disposed in the processing chamber 201, the thickness of the film formed on the wafer 200 is largest when the electrodes having the short pipes formed of quartz are used as the first and second electrodes 269 and 270, secondly largest when the electrodes having the short pipes formed of Ni are used as the first and second electrodes 269 and 270, and smallest when the electrodes having no short pipe are used as the first and second electrodes 269 and 270.

When the processing temperature is equal to 545° C., it is apparent from the measurement data shown in FIG. 12 that, as in the case of the processing temperature of 470° C., the inter-plane uniformity is more enhanced when the electrodes having the short pipes formed of any one of Ni and quartz are used as the first and second electrodes 269 and 270 as compared with the case where the electrodes having no short pipe are used as the first and second electrodes 269 and 270.

Specifically, in the case where the processing temperature is equal to 545° C., the inter-plane uniformity is equal to 0.903% when the electrodes having no short pipe 290 are used as the first and second electrodes 269 and 270, is equal to 0.551% when the electrodes having the short pipes formed of quartz are used as the first and second electrodes 269 and 270, and is equal to 0.737% when the electrodes having the short pipes formed of Ni are used as the first and second electrodes 269 and 270. As described above, even when the processing temperature is equal to 545° C., the inter-plane uniformity is more enhanced when the electrodes having the short pipes 290 formed of any one of Ni and quartz are used as the first and second electrodes 269 and 270 as compared with the case where the electrodes having no short pipe 290 are used as the first and second electrodes 269 and 270.

In FIG. 13, the measurement data of the films formed on the wafers 200 at the processing temperature of 545° C. are shown for every electrode type being used, every position at which the wafer 200 is disposed in the processing chamber 201 and every position in the wafer 200. The measurement data shown in FIG. 13 concern the variation rate on a peripheral-direction basis of the film formed on the wafer 200. In FIG. 13, the position at which the variation rate for each peripheral direction is measured is set to be the center position, a position 1, a position 2 and a position 3. Here, the distance from the center of the wafer 200 is large in the order of the position 1, the position 2 and the position 3.

As shown in FIG. 13, in the case where the processing temperature is equal to 545° C., as in the case of the processing temperature of 470° C., irrespective of the position at which the wafer 200 is disposed in the processing chamber 201 and the peripheral-direction position in the wafer 200, the variation rate for each peripheral direction is smaller when the electrodes having the short pipes formed of Ni are used as the first and second electrodes 269 and 270 as compared with the case where the electrodes having the short pipes formed of quartz are used as the first and second electrodes 269 and 270.

The present invention is characterized by the matters described in claims, however, it also contains the following matters.

[Appendix 1]

A substrate processing apparatus comprising:
a processing chamber in which a substrate is mounted;
a gas supply unit that supplies processing gas into the processing chamber;
a gas exhaust unit that exhausts atmospheric gas in the processing chamber;
at least a pair of electrodes to which high-frequency power is applied to set the processing gas to an active state; and
a mount pipe in which each of the pair of electrodes is mounted while at least one place thereof is bent, wherein each of the electrodes comprises a core wire formed of a metal and plural pipe bodies that are joined to one another through the core wire so as to be bendable, and less thermally deformed than the core wire.

[Appendix 2]

In the substrate processing apparatus described in [Appendix 1], the pipe bodies are formed metal or insulating material.

[Appendix 3]

In the substrate processing apparatus described in [Appendix 2], the pipe bodies are formed of quartz.

[Appendix 4]

In the substrate processing apparatus described in [Appendix 1], the shape of the pipes is substantially cylindrical or substantially spherical.

[Appendix 5]

In the substrate processing apparatus described in [Appendix 1], the core wire is formed of a plastically deformable metal.

[Appendix 6]

In the substrate processing apparatus described in [Appendix 1], the core wire is formed of nickel.

[Appendix 7]

In the substrate processing apparatus described in [Appendix 1], each of the electrodes is further provided with a flexible meshed member that is formed of a metal and provided so as to cover the outer surfaces of the plural pipe bodies.

[Appendix 8]

In the substrate processing apparatus described in [Appendix 1], the pipe bodies are formed of an electrically conductive material.

[Appendix 9]

A substrate processing apparatus comprising:
a processing chamber in which plural substrates are mounted;
a gas supply unit that supplies processing gas into the processing chamber;
a gas exhaust unit that exhausts atmospheric gas in the processing chamber;
at least a pair of electrodes to which high-frequency power is applied to set the processing gas to an active state;
a mount pipe in which each of the pair of electrodes is mounted while at least one place thereof is bent; and
a heating unit that is provided to the outside of the processing chamber to heat the atmospheric gas in the processing chamber, wherein each of the electrodes comprises plural internal members formed of a metal or insulating material, a core wire formed of a metal which joins the internal members to one another, and a meshed outside member formed of a metal that is provided so as to cover the outer surfaces of the internal members.

As described above, the present invention can be applied to a substrate processing apparatus used in thermal processing of a semiconductor wafer, a glass substrate, etc.

What is claimed is:

1. A substrate processing apparatus comprising:
a processing chamber in which a substrate is mounted;
a gas supply unit that supplies processing gas into the processing chamber;
a gas exhaust unit that exhausts atmospheric gas in the processing chamber;
at least a pair of electrodes to which high-frequency power is applied to set the processing gas to an active state; and
a mount pipe in which each of the pair of electrodes is mounted while at least one place thereof is bent, wherein each of the electrodes comprises a core wire formed of a metal and plural pipe bodies that are joined consecutively to one another through the core wire so as to be bendable, less thermally deformed than the core wire, and are formed of an insulating material, wherein:
each of the electrodes is further provided with a flexible meshed member that is formed of a metal and provided so as to cover the outer surfaces of the plural pipe bodies,
a first end side of a first electrode of the at least pair of electrodes is configured to be inserted into the mount pipe and a second end side of the first electrode is configured to be pressed, which allows the first electrode to be inserted in the mount pipe along a bent portion of the mount pipe, and
the plural pipe bodies adjoining each other come into contact with at least a portion of an adjoining pipe body.

2. The substrate processing apparatus according to claim 1, wherein the pipe bodies are formed of quartz.

3. The substrate processing apparatus according to claim 1, wherein the shape of the pipes is substantially spherical.

4. The substrate processing apparatus according to claim 1, wherein the core wire is formed of a plastically deformable metal.

5. The substrate processing apparatus according to claim 1, wherein the core wire is formed of nickel.

6. The substrate processing apparatus according to claim 1, wherein each electrode is mounted into a respective bent mount pipe by inserting each first end side of each electrode into the mount pipe and moving the each first end side along the mount pipe through applying pressure to a second end side of each electrode until each electrode is mounted in each respective mount pipe.

7. An electrode comprising:
a core wire formed of a metal; and
plural pipe bodies that are joined consecutively to one another through the core wire so as to be bendable, less thermally deformed than the core wire, and are formed of an insulating material, wherein:
the electrode is provided with a flexible meshed member that is formed of a metal and provided so as to cover the outer surfaces of the plural pipe bodies,
a first end side of the electrode is configured to be inserted into the mount pipe and a second end side of the electrode is configured to be pressed, which allows the first electrode to be inserted in the mount pipe along a bent portion of the mount pipe,
the electrode is configured to be applied with high-frequency power to set a processing gas to active state,
the plural pipe bodies adjoining each other come into contact with at least a portion of an adjoining pipe body.

8. A method of manufacturing a semiconductor device comprising:
mounting a substrate into a processing chamber, and
applying high-frequency power to at least a pair of electrodes, each of the electrodes comprises a core wire formed of a metal and plural pipe bodies that are joined consecutively to one another through the core wire so as to be bendable, less thermally deformed than the core wire, and are formed of an insulating material, to set a processing gas in the processing chamber to an active state, wherein:
each of the electrodes is further provided with a flexible meshed member that is formed of a metal and provided so as to cover the outer surfaces of the plural pipe bodies,
a first end side of a first electrode of the at least pair of electrodes is configured to be inserted into the mount pipe and a second end side of the first electrode is configured to be pressed, which allows the first electrode to be inserted in the mount pipe along a bent portion of the mount pipe, and
the plural pipe bodies adjoining each other come into contact with at least a portion of an adjoining pipe body.

9. The method of manufacturing a semiconductor device according to claim 8, wherein each electrode is mounted into a respective bent mount pipe by inserting each first end side of each electrode into the mount pipe and moving the each first end side along the mount pipe through applying pressure to a second end side of each electrode until each electrode is mounted in each respective mount pipe.

* * * * *